United States Patent
Chen et al.

(10) Patent No.: US 9,034,759 B2
(45) Date of Patent: May 19, 2015

(54) METHOD FOR FORMING INTERLEVEL DIELECTRIC (ILD) LAYER

(71) Applicant: UNITED MICROELECTRONICS CORP., Hsin-Chu (TW)

(72) Inventors: Jei-Ming Chen, Tainan (TW); Yuh-Min Lin, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 80 days.

(21) Appl. No.: 13/740,249

(22) Filed: Jan. 13, 2013

(65) Prior Publication Data

US 2014/0199836 A1 Jul. 17, 2014

(51) Int. Cl.
*H01L 21/768* (2006.01)
(52) U.S. Cl.
CPC .............. *H01L 21/76819* (2013.01)

(58) Field of Classification Search
None
See application file for complete search history.

(56) References Cited

U.S. PATENT DOCUMENTS

| | | | |
|---|---|---|---|
| 5,885,894 A | 3/1999 | Wu | |
| 2010/0078690 A1* | 4/2010 | Sugiyama et al. | 257/288 |
| 2012/0313153 A1* | 12/2012 | Zhang et al. | 257/288 |
| 2013/0043590 A1* | 2/2013 | Lin et al. | 257/741 |

* cited by examiner

*Primary Examiner* — Charles Garber
*Assistant Examiner* — Stanetta Isaac
(74) *Attorney, Agent, or Firm* — Winston Hsu; Scott Margo (57) ABSTRACT

A method for forming an interlevel dielectric (ILD) layer includes the following steps. A MOS transistor on a substrate is provided. A first undoped oxide layer is deposited to cover the substrate and the MOS transistor. The first undoped oxide layer is planarized. A phosphorus containing oxide layer is deposited on the first undoped oxide layer. A second undoped oxide layer is deposited on the phosphorus containing oxide layer.

19 Claims, 5 Drawing Sheets

METHOD FOR FORMING INTERLEVEL DIELECTRIC (ILD) LAYER

BACKGROUND OF THE INVENTION

1. Field of the Invention

The present invention relates generally to a method for forming an interlevel dielectric (ILD) layer, and more specifically to a method for forming an etch resistance interlevel dielectric (ILD) layer.

2. Description of the Prior Art

Multilevel metallization processes have been hitherto greatly applied on very large scale integration (VLSI). Before the metallization of a wafer, an interlevel dielectric (ILD) layer has to be deposited on the wafer in order to insulate the MOS transistor on the wafer from the connecting wires made in later processes to prevent the occurrence of short circuits. With the shrinking of the connecting wires in the wafer production, the properties and the quality of the ILD layer between each connecting layers are of great concerns.

Therefore, it becomes an important issue about depositing an uniform interlevel dielectric (ILD) layer without voids on a surface of a wafer, for enhancing the electrical performances of semiconductor components, such as the reliability.

SUMMARY OF THE INVENTION

The present invention provides a method for forming an interlevel dielectric (ILD) layer, which forms a stacked structure including an undoped oxide layer, a phosphorus containing oxide layer and an undoped oxide layer, for forming an interlevel dielectric (ILD) layer having excellent etch resistance and metal attachment.

The present invention provides a method for forming an interlevel dielectric (ILD) layer including the following steps. A MOS transistor on a substrate is provided. A first undoped oxide layer is deposited to cover the substrate and the MOS transistor. The first undoped oxide layer is planarized. A phosphorus containing oxide layer is deposited on the first undoped oxide layer. A second undoped oxide layer is deposited on the phosphorus containing oxide layer.

According to the above, the present invention provides a method for forming an interlevel dielectric (ILD) layer, which forms a first undoped oxide layer to cover a substrate and a MOS transistor, which then planarizes the first undoped oxide layer and then performs a cleaning process to clean the top surface of the first undoped oxide layer, enabling oxide layers formed thereon to attach it perfectly, thereby providing an improved reliability to the formed semiconductor component. Since the first undoped oxide layer is an undoped oxide layer, vias generated in the first undoped oxide layer during the cleaning process can be avoided thanks to the better etch resistance compared to that of a phosphorus containing oxide layer. Contact plugs formed therein electrically connecting each other can therefore be avoided. Thereafter, a phosphorus containing oxide layer and a second undoped oxide layer are sequentially deposited on the first undoped oxide layer to make up for the lack of phosphorous content of the first undoped oxide layer, so that sufficient metal attachment can be provided. Moreover, the desired thickness of the interlevel dielectric (ILD) layer can be approached by adjusting the thickness of the second undoped oxide layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
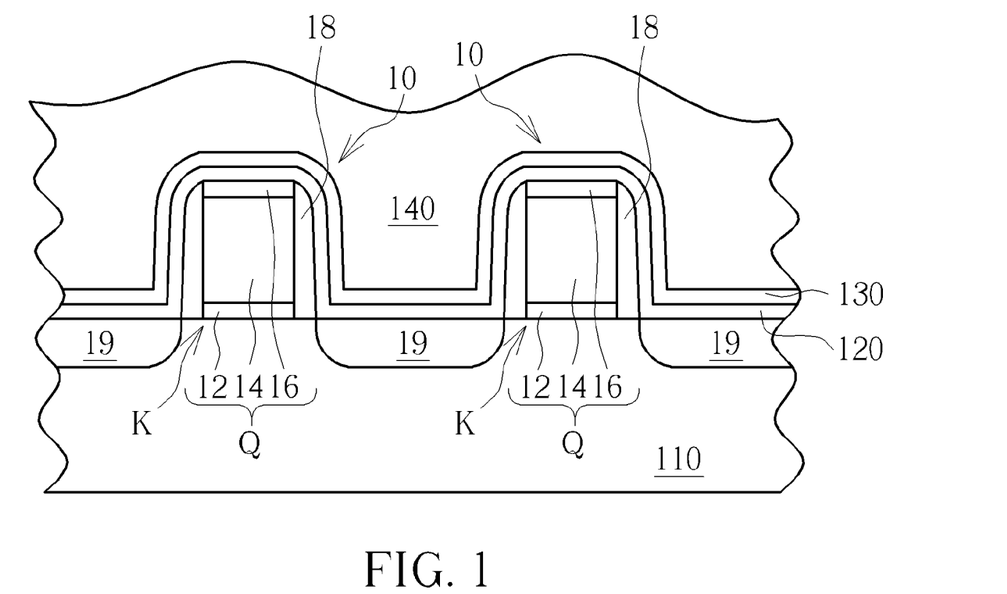
FIGS. 1-5 schematically depict cross-sectional views of a method for forming an interlevel dielectric (ILD) layer according to a first embodiment of the present invention.

FIGS. 1-5 schematically depict cross-sectional views of a method for forming an interlevel dielectric (ILD) layer according to a first embodiment of the present invention. A gate-last for high-K first process is applied in this embodiment, but it is not limited thereto. In another embodiment, a gate-last for high-K last process, a gate-first process or a polysilicon gate process etc may be applied. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate.

Then, two transistors 10 are formed on the substrate 110. For simplifying and clarifying the description of the present invention, there are two transistors 10, but it is not limited thereto. More precisely, the process of forming the transistors 10 may include the following steps. A stacked structure of a dielectric layer (not shown), an electrode layer (not shown) and a cap layer (not shown) are sequentially formed. Then, the cap layer (not shown), the electrode layer (not shown) and the oxide layer (not shown) are patterned to form two stacked structures Q including a dielectric layer 12, an electrode layer 14 and a cap layer 16 from bottom to top. A spacer material (not shown) covers each of the stacked structures Q and the entire substrate 110, and the spacer material (not shown) is patterned to respectively form two spacers 18 on the substrate 110 beside each of the stacked structures Q, thereby defining the positions of the source/drains in the substrate 110. Then, an ion implantation process is performed to form two sources/drains 19 in the substrate 110 beside each of the spacers 18 respectively.

In this embodiment, the dielectric layer 12 includes a dielectric layer having a high dielectric constant, which may be a metal containing dielectric layer including hafnium oxide, zirconium oxide or etc. Moreover, the dielectric layer having a high dielectric constant may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST). Furthermore, the dielectric layer 12 may further include a buffer layer (not shown) formed between the dielectric layer having a high dielectric constant and the substrate 110 for buffering both of them, wherein the buffer layer (not shown) may be an oxide layer, which may be formed through a thermal oxide process or a chemical oxide process, but not limited thereto. In another embodiment, the dielectric layer 12 may also be an oxide layer for being used as a dielectric layer of a polysilicon gate, or a sacrificial material layer, which will be removed in later processes. Moreover, a bottom barrier layer (not shown) may be selectively formed on the dielectric layer having a high dielectric constant to prevent metal formed thereon later from diffusing downward to the dielectric layer having a high dielectric constant, wherein the bottom barrier layer (not shown) may be titanium nitride, but not limited thereto. The electrode layer 14 may be a polysilicon layer, but it is not limited thereto. Since a gate-last for high-K first process is applied in this embodiment, the electrode layer 14 is a sacrificial electrode layer, which will be removed in later processes and replaced by a metal gate. The spacer 18 may be a single layer structure, a multilayer structure composed of silicon nitride or silicon oxide etc. The source/drain 19 may be implanted by trivalent ions or pentavalent ions such as boron or phosphorus, but it is not limited thereto.

Before the spacers 18 are formed to define the positions of the source/drains 19 and the source/drains 19 are formed, two spacers (not shown) may be selectively formed on the substrate 110 beside the stacked structures Q respectively, so that the positions of lightly doped sources/drains can be defined. Then, a lightly doped ion implantation process is performed to form two lightly doped sources/drains (not shown) in the substrate 110 beside the two spacers (not shown) respectively. Moreover, epitaxial structures (not shown) may be selectively formed on/in the substrate 110 beside the stacked structures Q before/after the sources/drains 19 are formed, or formed together with the sources/drains 19 at the same time. The lightly doped source/drain (not shown) may be implanted by trivalent ions or pentavalent ions such as boron or phosphorus, but it is not limited thereto. The epitaxial structure (not shown) may be a silicon germanium epitaxial structure, a silicon carbide epitaxial structure or a silicon phosphoric epitaxial structure etc, depending upon the electrical type of each of the transistors 10.

Please refer to FIG. 1, a contact etch stop layer 120 may be selectively formed to cover the substrate 110 and each of the MOS transistors 10, wherein the contact etch stop layer 120 may be a doped nitride layer or etc, used for inducing stresses in a gate channel K of each of the MOS transistors 10, so as to increase carrier mobility, but it is not limited thereto. Thereafter, a third undoped oxide layer 130 may be deposited to cover the substrate 110 and each of the MOS transistors 10 (or the contact etch stop layer 120). The third undoped oxide layer 130 may be an undoped silicate glass (USG), but it is not limited thereto. In this embodiment, the thickness of the third undoped oxide layer 130 is 450 angstroms, which may be formed by performing a thermal oxide process. In the thermal oxide process, the deposition rate of the thermal oxide process is slower than the deposition rate of a plasma-enhanced chemical vapor deposition (PECVD) process; the thermal oxide process is therefore suited for forming thinner oxide layers, such as the third undoped oxide layer 130. Besides, the covering capability of the thermal oxide process formed oxide layers is better than that of oxide layers formed through plasma-enhanced chemical vapor deposition (PECVD) processes or etc, and the oxide layers can therefore conformally cover the substrate 110 and each of the MOS transistors 10 (or the contact etch stop layer 120), and a better gap filling capability can be obtained when the spacing between each of the MOS transistors is reduced, according to the global miniaturization of the semiconductor components.

A phosphorus containing oxide layer 140 is deposited to cover the third undoped oxide layer 130, wherein the phosphorus containing oxide layer 140 may be a phosphosilicate glass (PSG) or a borophosphosilicate glass (BPSG), and the mass concentration of the phosphorous content in the phosphorus containing oxide layer 140 may be about 3% to induce sufficient metal attachment capability, but it is not limited thereto. In this embodiment, due to the phosphorus containing oxide layer 140 being 4000 angstroms, it is preferably formed by performing a plasma-enhanced chemical vapor deposition (PECVD) process. Although layers formed through a plasma-enhanced chemical vapor deposition (PECVD) process do not have a covering capability and a gap filling capability as good as layers formed through thermal oxide processes, the phosphorus containing oxide layer 140 in this embodiment can still have a smooth profile and cover the layer well, since the third undoped oxide layer 130 is formed before the phosphorus containing oxide layer 140 is formed. The processing rate is increased and the processing costs are also reduced because the phosphorus containing oxide layer 140 is formed through a plasma-enhanced chemical vapor deposition (PECVD) process.

Figure 2:
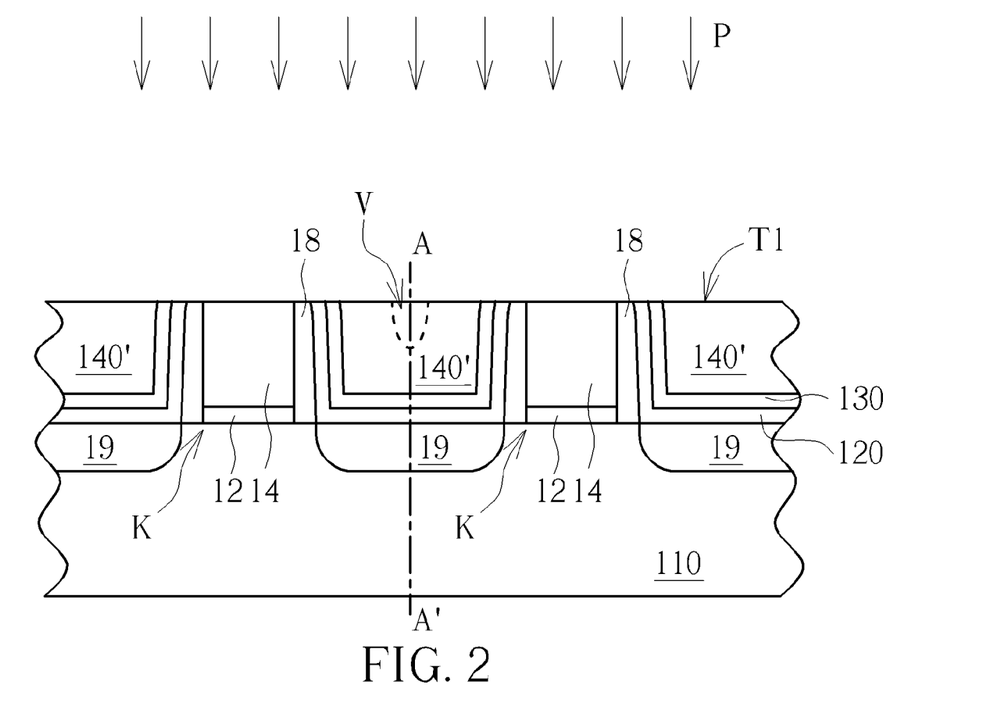

As shown in FIG. 2, a chemical mechanical polishing (CMP) process is performed to planarize the phosphorus containing oxide layer 140, so that a planarized phosphorus containing oxide layer 140' is formed. The cap layer 16 is simultaneously removed to expose the electrode layer 14. At this time, the thickness of the phosphorus containing oxide layer 140' may be 1500~1600 angstroms. Thereafter, a cleaning process P is performed to clean a top surface T1 of the phosphorus containing oxide layer 140' and to further remove residues on the surface of the phosphorus containing oxide layer 140', thereby enabling materials covering thereon to adhere closer to the phosphorus containing oxide layer 140', so that the reliability of the formed semiconductor component can be increased. The cleaning process P includes a wet etching process, which may be a dilute hydrofluoric acid (DHF) containing wet etching process, but it is not limited thereto. Since the phosphorus containing oxide layer 140' is easily etched during the cleaning process P, a tiny gap in the surface of the phosphorus containing oxide layer 140' is enlarged, and a void V will be generated in the phosphorus containing oxide layer 140' directing the paper.

Figure 3:
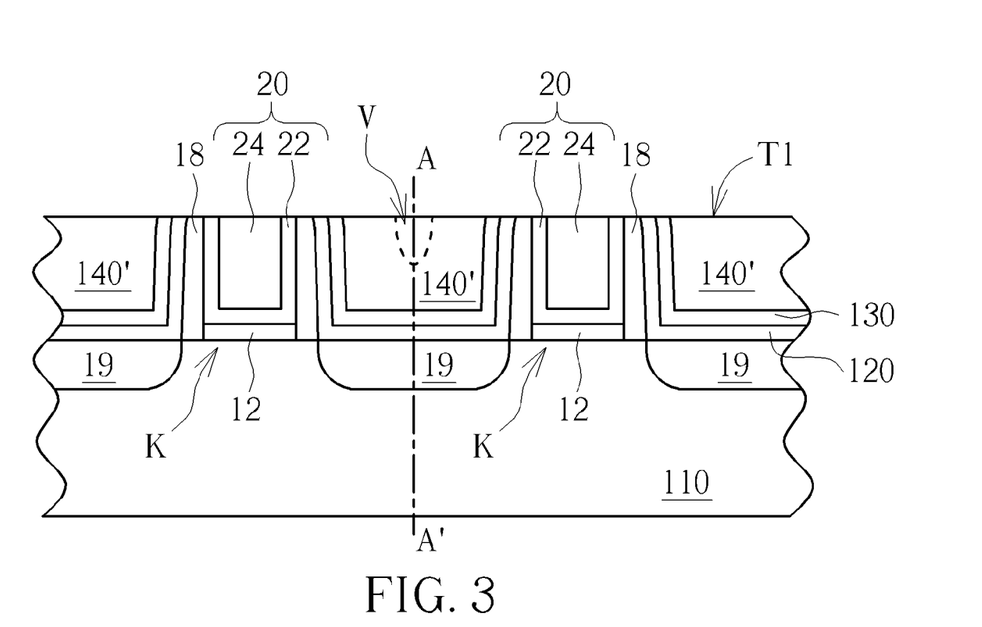

As shown in FIG. 3, a metal gate replacement process is performed to replace the electrode layer 14 by metal gates 20. More precisely, the electrode layer 14 is removed to form recesses (not shown) on the dielectric layer 12 between the spacers 18. A selective etch stop layer (not shown), a work function metal layer (not shown) and a low resistivity material (not shown) are sequentially filled and planarized, so that the metal gates 20 including a selective etch stop layer (not shown), a work function metal layer 22 and a low resistivity material 124 are formed. The selective etch stop layer (not shown) may be a tantalum nitride layer; the work function metal layer 22 may be an aluminum titanium metal layer or a titanium nitride metal layer etc, depending upon the electrical type of the desired formed metal gates 20; the low resistivity material 24 may be aluminum, tungsten, titanium aluminum alloy or cobalt tungsten phosphide (CoWP) etc, but it is not limited thereto.

Figure 4:
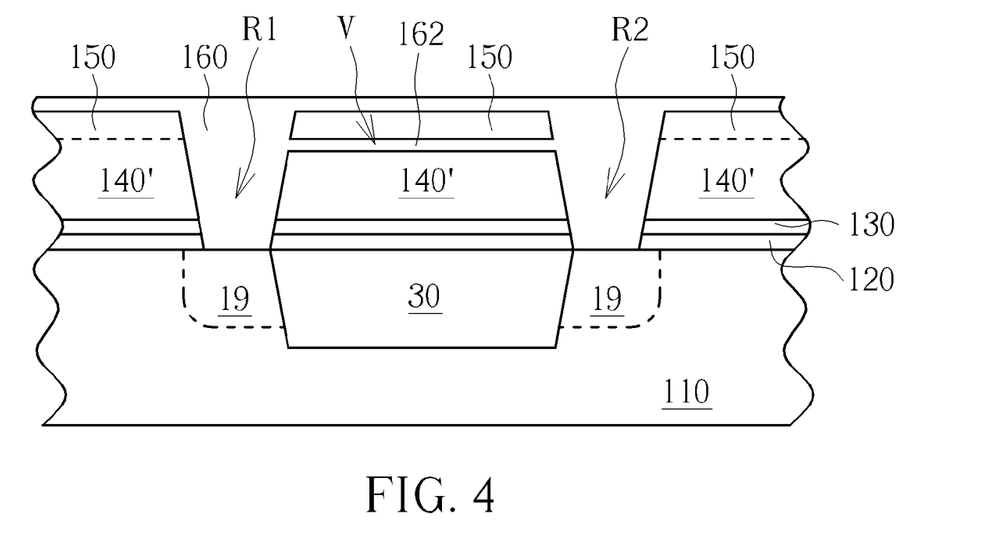
Figure 5:
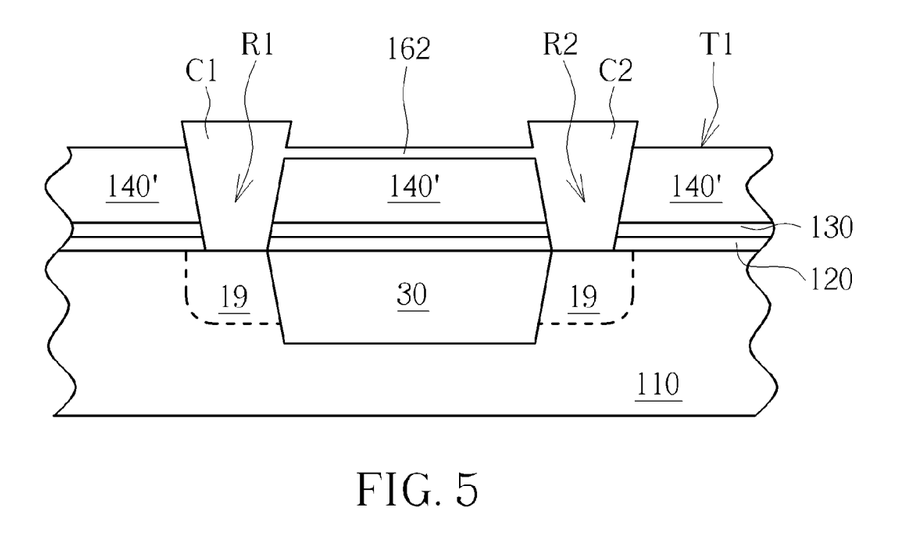

Please refer to FIG. 4, which depicts a cross-sectional view of FIGS. 2-3 along the AA' line. After the metal gates 20 are formed, a cap oxide layer 150 is formed to cover the phosphorus containing oxide layer 140' to achieve the thickness of an interlevel dielectric (ILD) layer, such as 1800~2000 angstroms, wherein the cap oxide layer 150 is preferred to be formed through a plasma-enhanced chemical vapor deposition (PECVD) process, so that the desired thickness can be achieved quickly. In another embodiment, when a polysilicon gate process or a gate first process is utilized, the step of replacing the metal gates 20 can be omitted, which means that the cap oxide layer 150 is directly formed after the phosphorus containing oxide layer 140' is formed. Then, the cap oxide layer 150, the phosphorus containing oxide layer 140', the third undoped oxide layer 130 (and the contact etch stop layer 120) are patterned to form contact holes R1 and R2 therein, thereby exposing parts of the source/drains 19, and then a metal 160 is filled into the contact holes R1 and R2. Thereafter, as shown in FIG. 5, a chemical mechanical polishing (CMP) process is performed to planarize the metal 160 until the phosphorus containing oxide layer 140' is exposed, so contact plugs C1 and C2 are formed in the contact holes R1 and R2 respectively and electrically connect the source/drains 19. An isolation structure 30 electrically isolates each of the source/drains 19 along the AA' line.

As shown in FIG. 4, the metal 160 is also filled into the void V, and a metal bridge 162 is formed between the contact holes R1 and R2. Furthermore, due to the depth of the metal bridge 162 being lower than the level of the top surface T1 of the phosphorus containing oxide layer 140', the metal 160 into the void V can not be removed even after planarization, leading the contact plugs C1 and C2 in the contact holes R1 and R2 to electrically connect each other and creating therefore short circuits, as shown in FIG. 5.

A second embodiment in the present invention is also presented, which can solve the problem of voids caused by the cleaning process in the first embodiment. A gate-last for high-K last process is utilized in the second embodiment, but a gate-last for high-k first process, a gate first process or a polysilicon gate process etc may also be additionally utilized in this embodiment.

Figure 6:
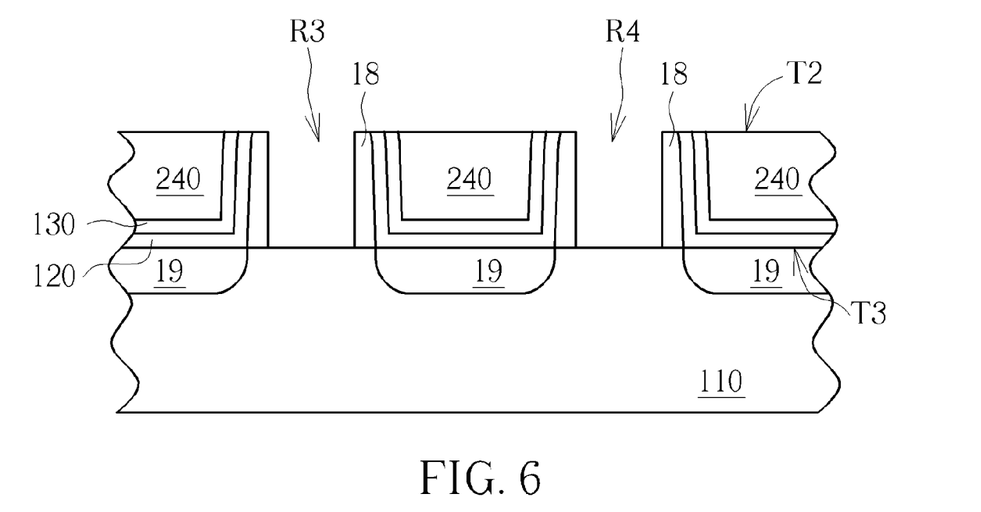
FIGS. 6-10 schematically depict cross-sectional views of a method for forming an interlevel dielectric (ILD) layer according to a second embodiment of the present invention.

FIGS. 6-10 schematically depict cross-sectional views of a method for forming an interlevel dielectric (ILD) layer according to a second embodiment of the present invention. Please refer to FIGS. 1-2, 6. As shown in FIGS. 1-2, the structure in this embodiment is similar to the structure in the first embodiment, but the only difference is that the phosphorus containing oxide layer 140' of the first embodiment is replaced by a first undoped oxide layer (noted 240 in FIG. 6). That is, a first undoped oxide layer (not shown) in this embodiment covers the third undoped oxide layer 130, and then the first undoped oxide layer (not shown) is planarized to form a planarized first undoped oxide layer 240 as shown in FIG. 6, so that the planarized first undoped oxide layer 240 has a flat top surface T2 and a relative non-flat bottom surface T3, wherein the first undoped oxide layer (not shown) is formed through a plasma-enhanced chemical vapor deposition (PECVD) process to increase the processing rate and reduce the processing costs. After the first undoped oxide layer 240 is formed, the cleaning process P described in the first embodiment is also performed. This way, the etch resistance capability of the first undoped oxide layer 240 is better than that of the phosphorus containing oxide layer 140', which means that the etching rate of the cleaning process P, such as a dilute hydrofluoric acid (DHF) wet etching process, to the first undoped oxide layer 240 is lower than the etching rate to the phosphorus containing oxide layer 140'. The void V in the first embodiment can therefore be avoided in this embodiment, thereby preventing the contact plugs from electrically connecting each other, and avoiding short circuits.

Since a gate-last for high-K last process is utilized in this embodiment, the dielectric layer 12 is a sacrificial gate dielectric layer, such as an oxide layer, which will be removed in later processes. Other processes in this embodiment are common to the first embodiment, and are not described again. Thus, as shown in FIG. 6 (continuing FIGS. 1-2), because of the gate-last for high-K last process being applied in this embodiment, the electrode layer 14 and the dielectric layer 12 are removed and the substrate 110 is exposed after the cap layer 16 is removed and the electrode layer 14 is exposed, so that recesses R3 and R4 are formed between the spacers 18.

Figure 7:
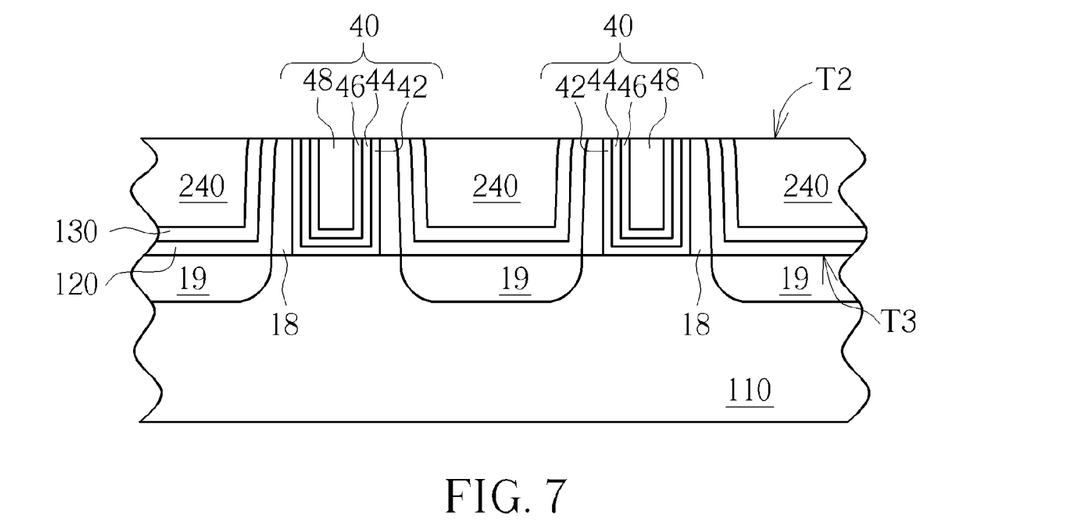

As shown in FIG. 7, a metal gate replacement process is performed to form metal gates 40. More precisely, after the electrode layer 14 and the dielectric layer 12 are removed, a buffer layer (not shown), a dielectric layer having a high dielectric constant (not shown), a selective bottom barrier layer (not shown), a work function metal layer (not shown) and a low resistivity material (not shown) are sequentially filled into the recesses R3 and R4, and are planarized to form the metal gates 40 including a buffer layer 42, a dielectric layer having a high dielectric constant 44, a selective bottom barrier layer (not shown), a work function metal layer 46 and a low resistivity material 48. The buffer layer 42 may be an oxide layer, which may be formed through a thermal oxide process or a chemical oxide process etc; the dielectric layer having a high dielectric constant 44 may be the group selected from hafnium oxide ($HfO2$), hafnium silicon oxide ($HfSiO4$), hafnium silicon oxynitride (HfSiON), aluminum oxide ($Al2O3$), lanthanum oxide ($La2O3$), tantalum oxide ($Ta2O5$), yttrium oxide ($Y2O3$), zirconium oxide ($ZrO2$), strontium titanate oxide ($SrTiO3$), zirconium silicon oxide ($ZrSiO4$), hafnium zirconium oxide ($HfZrO4$), strontium bismuth tantalite ($SrBi2Ta2O9$, SBT), lead zirconate titanate ($PbZr_xTi_{1-x}O3$, PZT) and barium strontium titanate ($Ba_xSr_{1-x}TiO3$, BST); the selective bottom barrier layer (not shown) may be composed of titanium nitride or etc; the work function metal layer 46 may be an aluminum titanium metal layer or a titanium nitride metal layer etc, depending upon the electrical type of the metal gates 40; the low resistivity material 48 may be aluminum, tungsten, aluminum titanium alloy or cobalt tungsten phosphide (CoWP), but it is not limited thereto.

Figure 8:
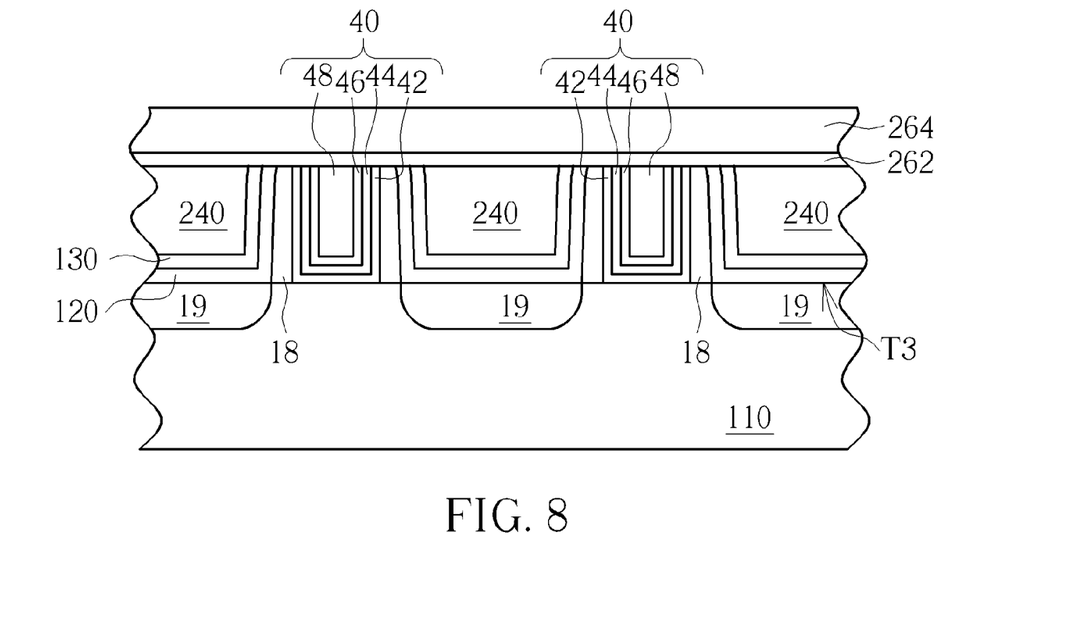

As shown in FIG. 8, a phosphorus containing oxide layer 262 is deposited on the first undoped oxide layer 240 and the metal gates 40. The phosphorus containing oxide layer 262 may be a phosphosilicate glass (PSG) or a borophosphosilicate glass (BPSG) etc. The thickness of the phosphorus containing oxide layer 262 in this embodiment is only about 100 angstroms, so that the mass concentration of phosphorus in the phosphorus containing oxide layer 262 in this embodiment is preferably 3%~5% so as to keep the metal attaching capability of the first embodiment, but it is not limited thereto. A second undoped oxide layer 264 is deposited on the phosphorus containing oxide layer 262. The second undoped oxide layer 264 may be an undoped silicate glass (USG), and the desired thickness of an interlevel dielectric (ILD) layer can be approach by adjusting the thickness of the second undoped oxide layer 264.

The second undoped oxide layer 264 is preferably formed through a plasma-enhanced chemical vapor deposition (PECVD) process in order to increase the processing rate and reduce the processing costs, and the phosphorus containing oxide layer 262 can be formed through a plasma-enhanced chemical vapor deposition (PECVD) process with a relatively slower processing rate so as to be able to adjust the thickness. In this embodiment, the thickness of the phosphorus containing oxide layer 262 plus the second undoped oxide layer 264 is equal to the thickness of the cap oxide layer 150 of the first embodiment. In other words, the phosphorus containing oxide layer 262 and the second undoped oxide layer 264 in this embodiment replace the cap oxide layer 150 in the first embodiment. In this way, the metal adhesivity of the formed interlevel dielectric (ILD) layer is kept without increasing the thickness of the formed interlevel dielectric (ILD) layer.

Figure 9:
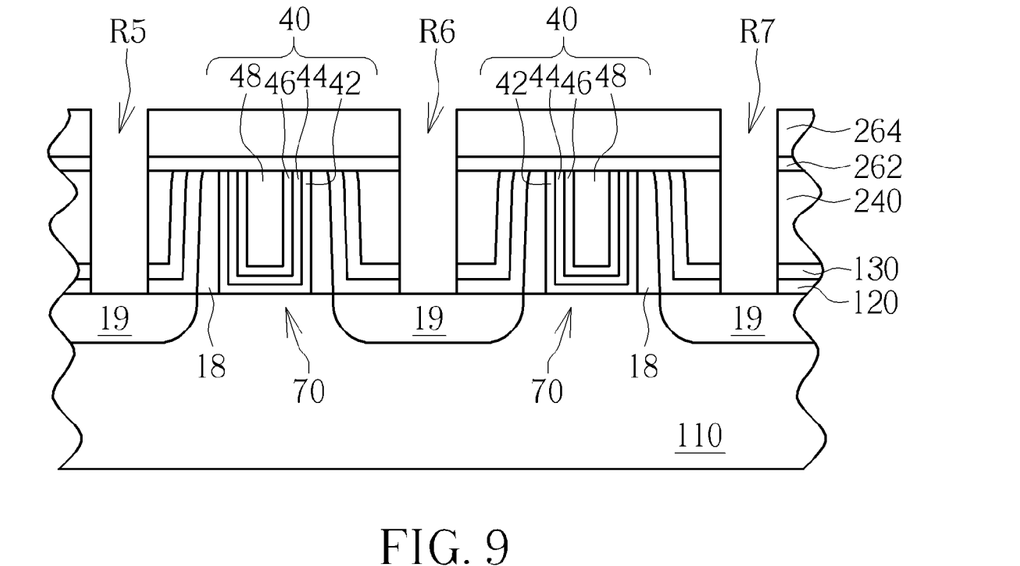
Figure 10:
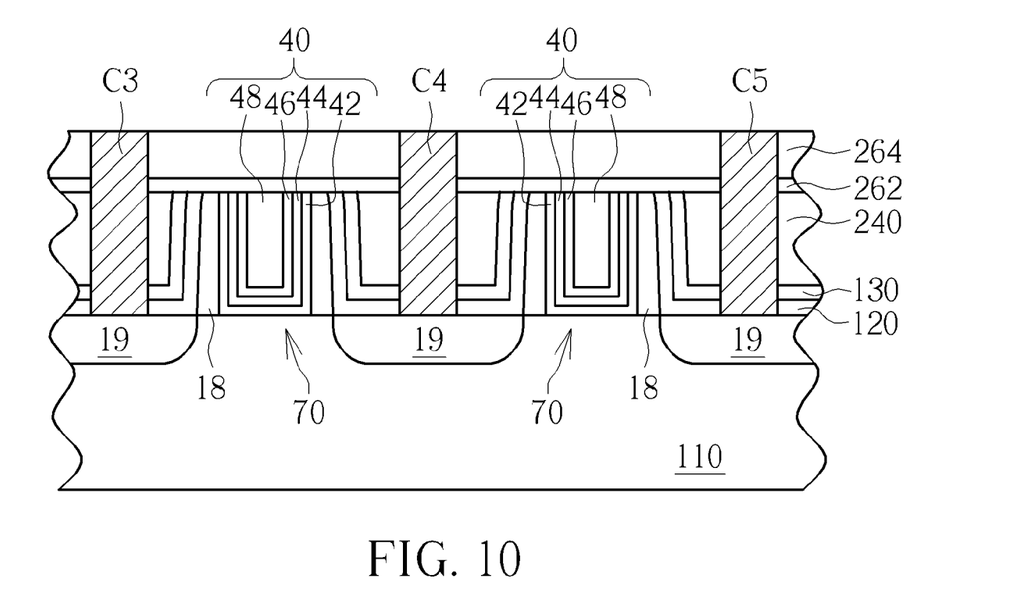

As shown in FIGS. 9-10, a plurality of contact plugs C3, C4, C5 are formed in the second undoped oxide layer 264, the phosphorus containing oxide layer 262, the first undoped oxide layer 240, the third undoped oxide layer 130 (and the contact etch stop layer 120) and they electrically connect the two sources/drains 19 of the two MOS transistors 70 respectively. More precisely, as shown in FIG. 9, the second undoped oxide layer 264, the phosphorus containing oxide layer 262, the first undoped oxide layer 240, the third undoped oxide layer 130 (and the contact etch stop layer 120) are patterned, to form a plurality of contact holes R5, R6, R7 in the second undoped oxide layer 264, the phosphorus containing oxide layer 262, the first undoped oxide layer 240, the third undoped oxide layer 130 (and the contact etch stop layer 120) and expose part of the source/drains 19. As shown in FIG. 10, a metal (not shown) is filled into the contact holes R5, R6, R7 and is planarized until the second undoped oxide layer 264 is exposed, thereby respectively forming the contact plugs C3, C4, C5 in the contact holes R5, R6, R7. Thereafter, processes such as the formation of interconnect structures thereon may be performed.

To summarize, the present invention provides a method for forming an interlevel dielectric (ILD) layer, which forms a third undoped oxide layer covering a substrate and a MOS transistor, wherein the third undoped oxide layer is thinner than later formed oxide layers, and is preferably formed through a thermal oxide process to have better covering quality and gap filling capability; a first undoped oxide layer covers the third undoped oxide layer, wherein the first undoped oxide layer may be an undoped silicate glass (USG) and is preferably formed through a plasma-enhanced chemical vapor deposition (PECVD) process so as to increase the processing rate and reduce the processing costs; then the first undoped oxide layer is planarized and a cleaning process is performed to clean the top surface of the first undoped oxide layer, thereby enabling oxide layers formed thereon to adhere more closely so the formed semiconductor component can therefore obtain a better reliability. Since the first undoped oxide layer is an undoped oxide layer, voids generated in the first undoped oxide layer caused by the cleaning process can be avoided because of the better etch resistance than that of a phosphorus containing oxide layer. The contact plugs formed therein must therefore avoid to be electrically connecting to each other.

Thereafter, a phosphorus containing oxide layer and a second undoped oxide layer are sequentially deposited on the first undoped oxide layer, and the mass concentration of phosphorus in the phosphorus containing oxide layer is preferably about 3%~5% to make up for the lack of the phosphorous content in the first undoped oxide layer, so that sufficient metal adhesivity can be induced. Moreover, the desired thickness of the formed interlevel dielectric (ILD) layer can be approached by adjusting the thickness of the second undoped oxide layer. The second undoped oxide layer is preferably formed through a plasma-enhanced chemical vapor deposition (PECVD) process in order to increase the processing rate and reduce the processing costs, and the phosphorus containing oxide layer may be formed through a plasma-enhanced chemical vapor deposition (PECVD) process with a lower processing rate for adjusting its thickness more easily.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming an interlevel dielectric (ILD) layer, comprising:
    providing a MOS transistor on a substrate;
    depositing a first undoped oxide layer to cover the substrate and the MOS transistor;
    planarizing the first undoped oxide layer;
    depositing a phosphorus containing oxide layer on the first undoped oxide layer after the first undoped oxide layer is planarized; and
    depositing a second undoped oxide layer on the phosphorus containing oxide layer.

2. The method for forming an interlevel dielectric (ILD) layer according to claim 1, wherein the first undoped oxide layer comprises an undoped silicate glass (USG).

3. The method for forming an interlevel dielectric (ILD) layer according to claim 1, wherein the first undoped oxide layer is formed by performing a plasma-enhanced chemical vapor deposition (PECVD) process.

4. The method for forming an interlevel dielectric (ILD) layer according to claim 1, further comprising:
    depositing a third undoped oxide layer to cover the substrate and the MOS transistor before the first undoped oxide layer is deposited.

5. The method for forming an interlevel dielectric (ILD) layer according to claim 4, wherein the third undoped oxide layer is formed by performing a thermal oxide process.

6. The method for forming an interlevel dielectric (ILD) layer according to claim 1, further comprising:
    forming a contact etch stop layer to cover the substrate and the MOS transistor before the first undoped oxide layer is deposited.

7. The method for forming an interlevel dielectric (ILD) layer according to claim 1, wherein the phosphorus containing oxide layer is formed by performing a plasma-enhanced chemical vapor deposition (PECVD) process.

8. The method for forming an interlevel dielectric (ILD) layer according to claim 1, wherein the phosphorus containing oxide layer comprises a phosphosilicate glass (PSG) or a borophosphosilicate glass (BPSG).

9. The method for forming an interlevel dielectric (ILD) layer according to claim 1, wherein the second undoped oxide layer is formed by performing a plasma-enhanced chemical vapor deposition (PECVD) process.

10. The method for forming an interlevel dielectric (ILD) layer according to claim 1, wherein the second undoped oxide layer comprises an undoped silicate glass (USG).

11. The method for forming an interlevel dielectric (ILD) layer according to claim 1, wherein the planarized first undoped oxide layer has a flat top surface and a respectively non-flat bottom surface.

12. The method for forming an interlevel dielectric (ILD) layer according to claim 1, further comprising:
    performing a cleaning process to clean a top surface of the first undoped oxide layer after the first undoped oxide layer is planarized.

13. The method for forming an interlevel dielectric (ILD) layer according to claim 12, wherein the cleaning process comprises a wet etching process.

14. The method for forming an interlevel dielectric (ILD) layer according to claim 13, wherein the wet etching process comprises a dilute hydrofluoric acid (DHF) containing wet etching process.

15. The method for forming an interlevel dielectric (ILD) layer according to claim 12, wherein the etching rate of the cleaning process to the first undoped oxide layer is lower than that to the phosphorus containing oxide layer.

16. The method for forming an interlevel dielectric (ILD) layer according to claim 1, wherein the thickness of the phosphorus containing oxide layer is substantially 100 angstroms.

17. The method for forming an interlevel dielectric (ILD) layer according to claim 1, further comprising:
- forming a plurality of contact plugs in the second undoped oxide layer, the phosphorus containing oxide layer and the first undoped oxide layer after the second undoped oxide layer is deposited to electrically connect the MOS transistor.

18. The method for forming an interlevel dielectric (ILD) layer according to claim 17, wherein the step of forming the contact plugs comprises:
- patterning the second undoped oxide layer, the phosphorus containing oxide layer and the first undoped oxide layer to form a plurality of contact holes in the second undoped oxide layer, the phosphorus containing oxide layer and the first undoped oxide layer;
- filling a metal in these contact holes; and
- planarizing the metal.

19. The method for forming an interlevel dielectric (ILD) layer according to claim 1, wherein the mass concentration of the phosphorous content in the phosphorus containing oxide layer is 3%~5%.

\* \* \* \* \*